(12) United States Patent
Chuang

(10) Patent No.: US 12,525,575 B2
(45) Date of Patent: Jan. 13, 2026

(54) SEMICONDUCTOR PACKAGE STRUCTURE AND METHOD FOR PREPARING SAME

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 955 days.

(21) Appl. No.: 17/712,399

(22) Filed: Apr. 4, 2022

(65) Prior Publication Data

US 2023/0230959 A1 Jul. 20, 2023

(30) Foreign Application Priority Data

Jan. 20, 2022 (CN) .......................... 202210068227.4

(51) Int. Cl.
| | |
|---|---|
| *H01L 25/065* | (2023.01) |
| *H01L 21/56* | (2006.01) |
| *H01L 23/00* | (2006.01) |
| *H01L 23/31* | (2006.01) |

(52) U.S. Cl.
CPC .......... *H01L 25/0657* (2013.01); *H01L 21/56* (2013.01); *H01L 23/3121* (2013.01); *H01L 24/16* (2013.01); *H01L 24/73* (2013.01); *H01L 2224/16145* (2013.01); *H01L 2224/73204* (2013.01)

(58) Field of Classification Search
CPC .. H01L 25/0657; H01L 25/0756; H01L 21/56
See application file for complete search history.

(56) References Cited

U.S. PATENT DOCUMENTS

| | | | |
|---|---|---|---|
| 10,700,014 | B2 | 6/2020 | Kim |
| 10,930,596 | B2 | 2/2021 | Guzek |
| 2008/0122087 | A1 | 5/2008 | Jobetto |

(Continued)

FOREIGN PATENT DOCUMENTS

| | | |
|---|---|---|
| CN | 109716509 A | 5/2019 |
| TW | 200832649 A | 8/2008 |

(Continued)

OTHER PUBLICATIONS

First Office Action of the Taiwanese application No. 111129202, issued on Mar. 6, 2023, 12 pages.

*Primary Examiner* — Mary A Wilczewski
(74) *Attorney, Agent, or Firm* — Kilpatrick Townsend & Stockton LLP

(57) ABSTRACT

A semiconductor package structure and a method for preparing the same are provided. The semiconductor package structure includes: a substrate; a first semiconductor chip located on the substrate, the first semiconductor chip having a first surface that is bare and the first surface having a silicon-containing surface; second semiconductor chip structures located on the first surface of the first semiconductor chip, the second semiconductor chip structures having second surfaces opposite to the first surface; a first package compound structure having a joint surface, the joint surface covering at least the first surface of the first semiconductor chip and the second surfaces of the second semiconductor chip structures. The joint surface has a silicon-containing surface.

13 Claims, 16 Drawing Sheets

(56) References Cited

U.S. PATENT DOCUMENTS

| | | | |
|---|---|---|---|
| 2012/0126402 A1* | 5/2012 | Hatakeyama | H01L 21/561 257/737 |
| 2013/0056871 A1 | 3/2013 | Yu | |
| 2020/0020638 A1* | 1/2020 | Heo | H01L 23/5383 |
| 2021/0028146 A1 | 1/2021 | Lee et al. | |
| 2021/0134757 A1 | 5/2021 | Gandhi et al. | |
| 2021/0375827 A1* | 12/2021 | Chen | H01L 25/0657 |
| 2023/0230959 A1* | 7/2023 | Chuang | H01L 25/50 257/668 |

FOREIGN PATENT DOCUMENTS

| | | |
|---|---|---|
| TW | 201814846 A | 4/2018 |
| TW | 202119587 A | 5/2021 |
| TW | 202127549 A | 7/2021 |

\* cited by examiner

SEMICONDUCTOR PACKAGE STRUCTURE AND METHOD FOR PREPARING SAME

CROSS-REFERENCE TO RELATED APPLICATION

The present application claims benefit of Chinese Application No. 202210068227.4, filed on Jan. 20, 2022, the contents of which are hereby incorporated by reference in its entirety.

BACKGROUND

In some package structures, molding compounds are used for packaging. However, the thermal expansion coefficient of molding compounds is quite different from that of silicon substrate in the chip, which leads to the inability to reduce the thickness of the chip. When the DRAM chips are stacked higher and higher, warping or damage will occur, which will affect the performance of the device.

SUMMARY

The disclosure relates to the technical field of a three-dimensional manufacturing process, in particular to a semiconductor package structure and a method for preparing the same.

According to a first aspect of the present disclosure, a semiconductor package structure is provided. The semiconductor package structure includes:

a substrate;

a first semiconductor chip located on the substrate, the first semiconductor chip having a first surface that is bare and the first surface having a silicon-containing surface;

second semiconductor chip structures located on the first surface of the first semiconductor chip, the second semiconductor chip structures having second surfaces opposite to the first surface;

a first package compound structure having a joint surface, the joint surface covering at least the first surface of the first semiconductor chip and the second surfaces of the second semiconductor chip structures, in which the joint surface has a silicon-containing surface.

According to a second aspect of the present disclosure, a method for preparing a semiconductor package structure is provided. The method includes:

providing a substrate;

forming a first semiconductor chip on the substrate, the first semiconductor chip having a first surface that is bare and the first surface having a silicon-containing surface;

forming a first layer of second semiconductor chips on the first surface of the first semiconductor chip, the first layer of the second semiconductor chips having second surfaces opposite to the first surface;

forming a first package compound structure between the first semiconductor chip and the first layer of the second semiconductor chips by spin coating, the first package compound structure having a joint surface, the joint surface covering at least the first surface of the first semiconductor chip and the second surfaces of the second semiconductor chips, in which the joint surface has a silicon-containing surface.

BRIEF DESCRIPTION OF THE DRAWINGS

In order to more clearly illustrate the embodiments of the disclosure, a brief description of the drawings required to be used in the embodiments will be provided below. Apparently, the accompanying drawings in the following description are merely some embodiments of the disclosure. For a person of ordinary skill in the art, other drawings can be obtained based on these drawings without creative work.

DETAILED DESCRIPTION

Figure 1A:
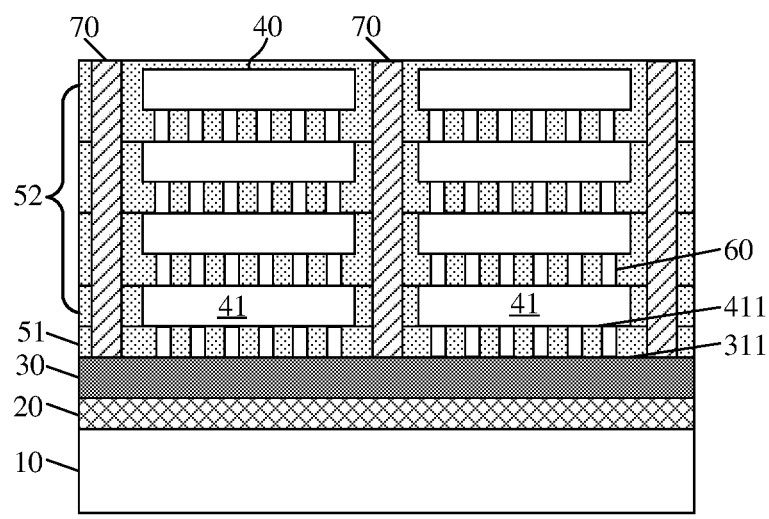
FIG. 1A illustrates a schematic structural diagram of a semiconductor package structure provided by an embodiment of the present disclosure.

Exemplary embodiments of the present disclosure will be described in more detail below with reference to the accompanying drawings. Although exemplary embodiments of the present disclosure are shown in the drawings, it should be understood that the present disclosure may be embodied in various forms which will not be limited to the specific embodiments set forth herein. Rather these embodiments are provided so that the disclosure will be more thoroughly understood and the scope of the disclosure will be fully conveyed to those skilled in the art.

In the context of the description, numerous specific details are given to provide a more thorough understanding of the disclosure. However it will be apparent to those skilled in the art that the present disclosure may be embodied without one or more of these details. In other examples, some technical features well known in the art are not described in order to avoid confusion with the present disclosure. That is, not all of the features of the actual embodiment are described herein and well-known functions and structures are not described in detail.

In the drawings, the dimensions of layers, regions, elements and their relative dimensions may be exaggerated for clarity. Throughout the description, the same reference numeral denotes the same element.

It should be understood that when an element or layer is described as "on", "adjacent to", "connected to" or "coupled to" another element or layer, it may be directly on the other element or layer, adjacent to the other element or layer, or connected to or coupled to the other element or layer, or there may be an intermediate element or layer. In contrast, when an element is described as "directly on", "directly adjacent to", "directly connected to" or "directly coupled to" another element or layer, there is no intermediate element or layer. It should be understood that although the terms "first", "second", "third" and the like may be used to describe various elements, components, regions, layers, and/or portions, these elements, components, regions, layers, and/or portions should not be limited by these terms. These terms are only used to distinguish one element, component, region, layer or portion from another element, component, region, layer or portion. Therefore, without departing from the teaching of the present disclosure, a first element, component, region, layer or portion discussed hereinafter may be expressed as a second element, component, region, layer or portion. While discussing a second element, component, region, layer or portion, it does not imply that a first element, component, region, layer or portion is necessarily present in the present disclosure.

Spatial relationship terms such as "beneath", "below", "lower", "under", "above", or "upper" may be used herein for convenience to describe a relationship between one element or feature and another element or feature shown in the drawings. It should be understood the spatial relationship terms tend to further include different orientations of a device in use and operation in addition to the orientations shown in the drawings. For example, if the device in the drawings is turned over, an element or feature described as being "below" or "under" or "beneath" another element will be oriented as being "above" the other element or feature. Therefore, the exemplary terms "below" and "under" may include up and down orientations. The device may also include additional orientations (e.g., rotation for 90 degrees or other orientations), and the spatial terms used herein are interpreted accordingly.

The terms used herein are intended to describe specific embodiments only and are not to be a limitation to the present disclosure. As used herein, the singular forms "a/an", "one", and "the/said" are intended to include the plural forms as well, unless the context clearly dictates otherwise. It should be further understood that when terms "comprise" and/or "/include" are used in the specification, it means that the stated features, integers, steps, operations, elements and/or components are present, but the presence or addition of one or more of other features, integers, steps, operations, elements, components and/or combinations is not excluded. When used herein, the term "and/or" includes any of the listed items and all combinations thereof.

In order to thoroughly understand the present disclosure, detailed operations and structures will be set forth in the following description in order to illustrate the technical solution of the present disclosure. Illustrative embodiments of the present disclosure are described in detail below. However the present disclosure may have other embodiments in addition to these detailed descriptions.

An embodiment of the present disclosure provides a semiconductor package structure. FIG. 1A illustrates a schematic structural diagram of a semiconductor package structure provided by an embodiment of the present disclosure.

Referring to FIG. 1A, the semiconductor package structure includes: a substrate 10; a first semiconductor chip 30 located on the substrate 10, the first semiconductor chip 30 having a first surface 311 that is bare and the first surface 311 having a silicon-containing surface; second semiconductor chip structures 40 located on the first surface 311 of the first semiconductor chip 30; the second semiconductor chip structures 40 having second surfaces 411 opposite to the first surface 311; a first package compound structure 51 which has a joint surface, the joint surface covering at least the first surface 311 of the first semiconductor chip 30 and the second surfaces 411 of the second semiconductor chip structures 40. The joint surface has a silicon-containing surface.

In the embodiment of the present disclosure, the joint surface of the first package compound structure and the surface of the chips both contain silicon, i.e. both are silicon surfaces. Compared with packaging with molding compounds, the jointing performance of the interface can be improved, thereby alleviating the problems of warping and damage of the package structure.

The material of the silicon-containing surface of the first package compound structure 51 may be Spin-on-Glass (SOG), silicon-containing Spin-on-Dielectric (SOD), or other silicon-containing spin-coating materials.

The substrate 10 may be an elementary substance semiconductor material substrate such as a silicon (Si) substrate, a germanium (Ge) substrate, etc., a compound semiconductor material such as a silicon germanium (SiGe) substrate, etc., or a silicon on insulator (SOI) substrate, a germanium on insulator (GeOI) substrate, etc.

In one embodiment, the first semiconductor chip 30 is a logic die.

In one embodiment, the semiconductor package structure further includes an adhesive layer 20 positioned between the substrate 10 and the first semiconductor chip 30. The adhesive layer 20 bonds the substrate 10 and the first semiconductor chip 30. The adhesive layer 20 can bond the substrate 10 and the first semiconductor chip 30 together and enhance adhesion between them, thereby improving the firmness of the semiconductor package structure.

The number of the second semiconductor chips stacked in a second semiconductor chip structure 40 may be more, including but not limited to two, four, eight, twelve, sixteen or the like. In an embodiment of the present disclosure as shown in FIG. 1A, the number of the second semiconductor chips stacked in the second semiconductor chip structure 40 is four.

The second semiconductor chips may be DRAM chips, SRAM chips, EEPROM chips, PCM chips, or the like.

In one embodiment, the second semiconductor chip structures 40 include a plurality of stacked second semiconductor chips. The package structure further includes a second package compound structure 52. The second package compound structure 52 is jointed to the first package compound structure 51 to wrap the second semiconductor chip structures 40. The second package compound structure 52 includes a silicon-containing compound.

The silicon-containing compound may be Spin-on-Glass (SOG), silicon-containing Spin-on-Dielectric (SOD), or other silicon-containing spin-coating materials.

By forming the second package compound structure 52 wrapping the second semiconductor chip structures 40, and the material of the second package compound structure 52 including a silicon-containing compound, the warping problem of the second semiconductor chip structures 40 can be alleviated, thereby further alleviating the warping problem of the whole package structure.

In one embodiment, the semiconductor package structure further includes conductive bumps 60 located between the first semiconductor chip 30 and the second semiconductor chip structures 40 and between adjacent two layers of the second semiconductor chips. The first package compound structure 51 and the second package compound structure 52 wrap the conductive bumps 60.

The first semiconductor chip 30 is electrically connected with the first layer of the second semiconductor chips 41 through the conductive bumps 60, and the adjacent two layers of the second semiconductor chips can also be electrically connected through the conductive bumps 60.

Figure 2:
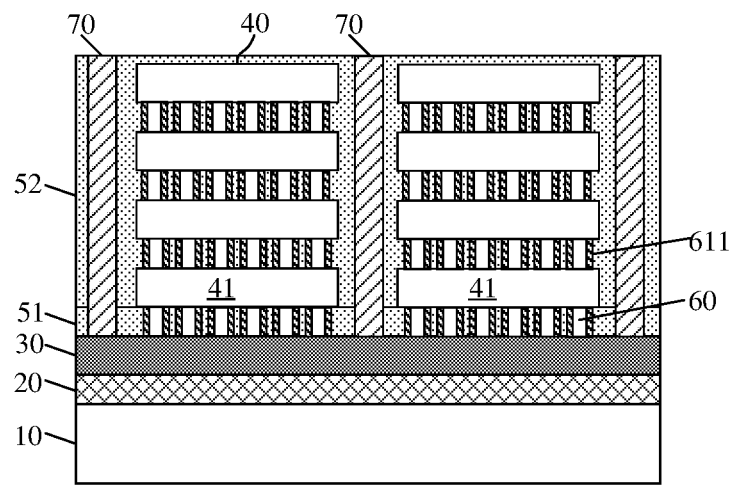
FIG. 2 illustrates a schematic structural diagram of a semiconductor package structure provided by yet another embodiment of the present disclosure.

In some embodiments, as shown in FIG. 2, outer surfaces of the conductive bumps 60 have silicon-containing surfaces 611. The silicon-containing surfaces 611 of the conductive bumps can improve the jointing performance between the package structure and the conductive bumps and can further alleviate the warping problem of the package structure.

Specifically, in order to ensure the electrical connection performance of the conductive bumps, the silicon-containing surface can be formed only on the sidewalls of the conductive bumps, and the silicon-containing surface is not formed on the surface where the conductive bumps are jointed to the upper and lower chips.

The material of the silicon-containing surfaces 611 of the conductive bumps 60 may be silicon dioxide.

Figure 1B:
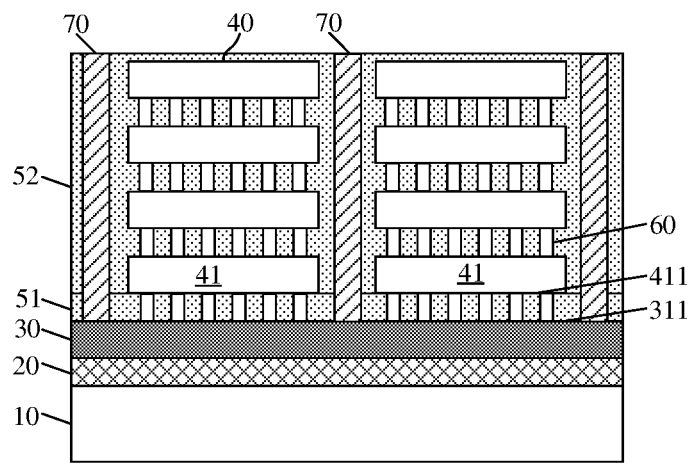
FIG. 1B illustrates a schematic structural diagram of a semiconductor package structure provided by another embodiment of the present disclosure.

In some other embodiments, as shown in FIGS. 1A and 1B, outer surfaces of the conductive bumps 60 may not have silicon-containing surfaces.

In one embodiment, the number of the second semiconductor chip structures is greater than or equal to 2. A plurality of the second semiconductor chip structures are paratactic on the first surface of the first semiconductor chip. In an embodiment of the present disclosure as shown in FIG. 1A, the number of the second semiconductor chip structures is 2.

The semiconductor package structure further includes filling layers 70 located at the periphery of the second semiconductor chip structures 40 and/or between adjacent two second semiconductor chip structures 40. The Young's modulus of the filling layers 70 is greater than the Young's modulus of the package compound structures.

In the embodiment shown in FIG. 1A, the filling layers 70 are formed at a periphery of the second semiconductor chip structures 40 and between adjacent two second semiconductor chip structures 40.

In some other embodiments, the filling layers 70 may be formed only at the periphery of the second semiconductor chip structures 40, or only between adjacent two second semiconductor chip structures 40.

Young's modulus is a physical quantity that can describe the ability of solid materials to resist deformation. The greater Young's modulus, the greater the ability to resist deformation. When Young's modulus is too low, it will be difficult to maintain the rigidity of the package structure, and problems such as deformation, warping or damage are prone to occur. Accordingly, in the embodiments of the present disclosure, by forming the filling layers 70 at the periphery of the second semiconductor chip structures 40, or, between adjacent two second semiconductor chip structures 40, and the Young's modulus of the filling layer 70 being larger than that of the package compound structures, the filling layers 70 can have sufficient strength to support the entire package structure, so that the package structure is not prone to deformation, warping, damage or the like.

The depth of the filling layers 70 extends to the upper surface of the first semiconductor chip 30.

In one embodiment, a material of the filling layers 70 includes glass fiber or carbon fiber. The Young's modulus of glass fiber or carbon fiber is large enough to alleviate the warping of the package structure.

In one embodiment, the Young's modulus of the first package compound structure 51 is less than the Young's modulus of the second package compound structure 52.

In one embodiment, the second package compound structure 52 includes a plurality of layers of second package compound stacked in sequence. Each layer of the second package compound wraps one layer of the second semiconductor chips. The Young's modulus of layers of the second package compound gradually increases in a direction from the first semiconductor chip 30 to the second semiconductor chip structures.

In one embodiment, except for the second package compound wrapping the first layer of the second semiconductor chips, each layer of the package compound above the first layer of the second semiconductor chips not only wraps one layer of the second semiconductor chips, but also wraps the conductive bumps 60 below the one layer of the second semiconductor chips.

A material with a low Young's modulus can absorb stress and reduce delaminating and warping of the chips. Therefore, the less the number of chip layers stacked in the direction from the first semiconductor chip 30 to the second semiconductor chip structures 40, the less the stress to be withstood. In the above embodiment, the Young's modulus of the first package compound structure is set to be smaller than the Young's modulus of the second package compound structure, and the Young's modulus of layers of the package compound in the second package compound structure are set to gradually increase in the direction from the first semiconductor chip 30 to the second semiconductor chip structures 40, so that the stress environment of the package structure can be more uniform, and the warping problem of the chips can be further alleviated.

In other embodiments, as shown in FIG. 1B, the second package compound structure 52 is a single-layer structure that wraps the second semiconductor chip structures 40. The Young's modulus of the second package compound structure 52 is constant in the direction from the first semiconductor chip 30 to the second semiconductor chip structures 40. In the embodiment of the present disclosure, since the Young's modulus of the second package compound structure is constant, the second package compound structure can be formed in the same step using the same material, thereby not only alleviating the warping problem of the chips but also simplifying the process.

In the embodiment of the present disclosure, the semiconductor package structure is a High Band Width Memory (HBM) package structure.

Figure 3:
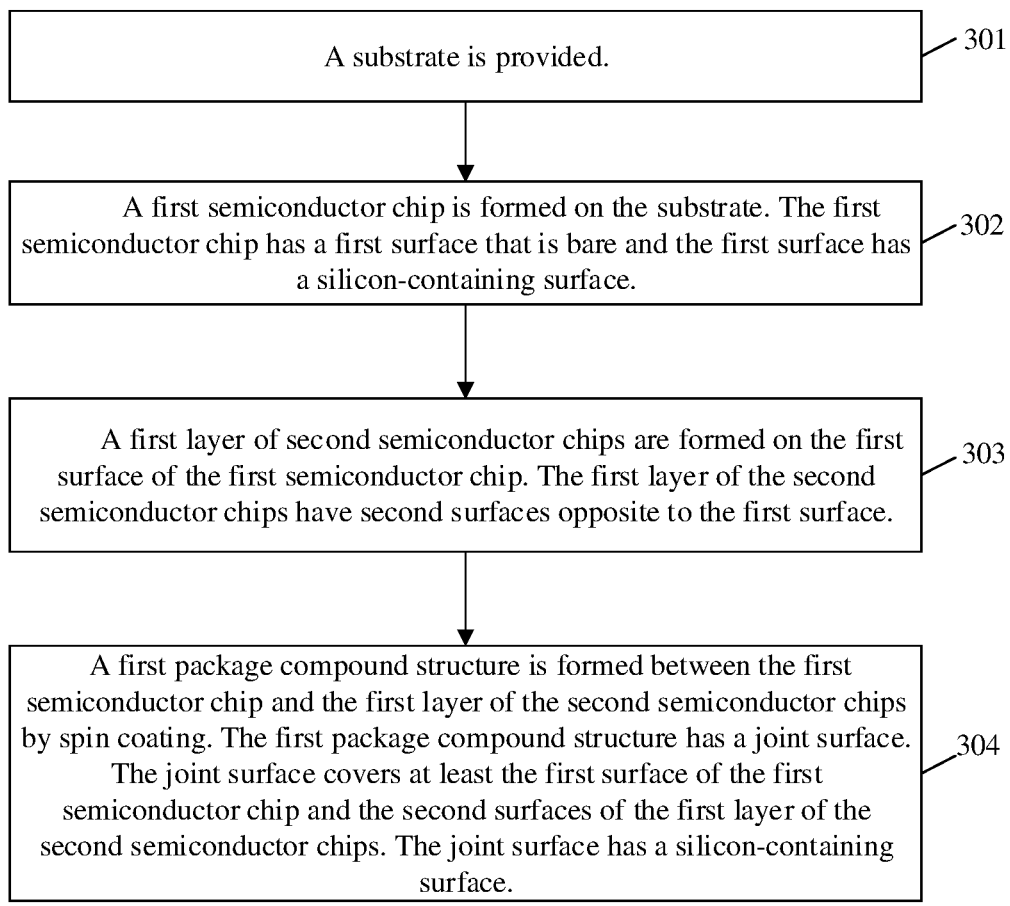
FIG. 3 illustrates a schematic flow chart of a method for preparing a semiconductor package structure provided by an embodiment of the present disclosure.

The embodiments of the present disclosure also provide a method for preparing a semiconductor package structure. In particular, referring to FIG. 3, the method includes the following operations.

S301: a substrate is provided.

S302: a first semiconductor chip is formed on the substrate. The first semiconductor chip has a first surface that is bare and the first surface has a silicon-containing surface.

S303: a first layer of second semiconductor chips are formed on the first surface of the first semiconductor chip. The first layer of the second semiconductor chips have second surfaces opposite to the first surface.

S304: a first package compound structure is formed between the first semiconductor chip and the first layer of the second semiconductor chips by spin coating. The first package compound structure has a joint surface. The joint surface covers at least the first surface of the first semiconductor chip and the second surfaces of the second semiconductor chips. The joint surface has a silicon-containing surface.

The method for preparing the semiconductor package structure provided by the embodiments of the present disclosure will be further described in detail below in combination with specific embodiments.

FIGS. 4A-4G illustrate a schematic structural diagram of a semiconductor package structure in the preparing process provided by an embodiment of the present disclosure. FIGS. 5A-5E illustrate a schematic structural diagram of a semiconductor package structure in the preparing process provided by another embodiment of the present disclosure.

It should be noted that the structures of the second package compound in the embodiment shown in FIGS. 4A-4G and the embodiment shown in FIGS. 5A-5E are different and the other structures are the same. Moreover, the preceding operations in the embodiment shown in FIGS.

Figure 4A:
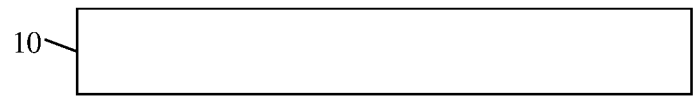
FIGS. 4A-4G illustrate a schematic structural diagram of a semiconductor package structure in the preparing process provided by an embodiment of the present disclosure.
Figure 4B:
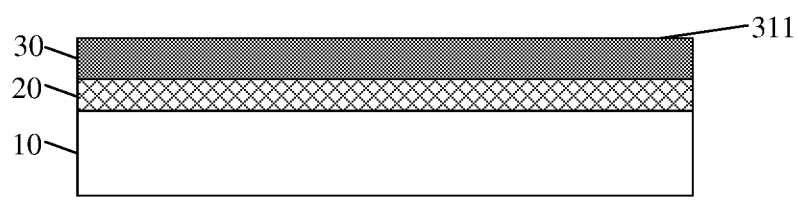
Figure 4C:
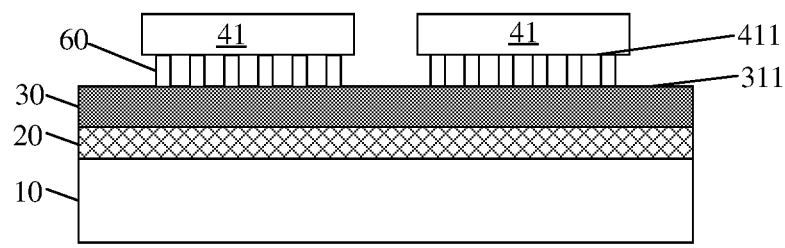
Figure 4D:
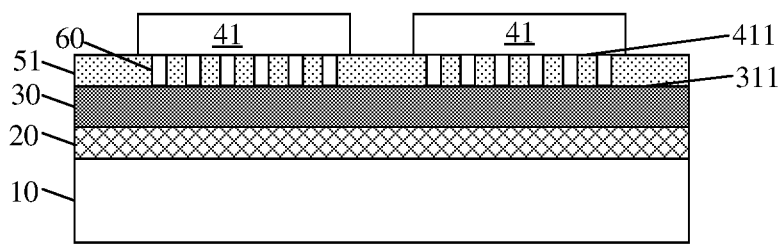
Figure 5A:
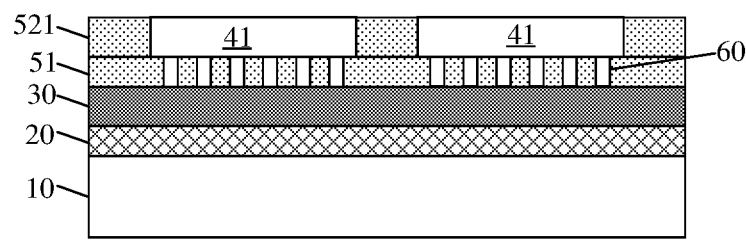
FIGS. 5A-5E illustrate a schematic structural diagram of a semiconductor package structure in the preparing process provided by another embodiment of the present disclosure.

5A-5E are the same as those shown in FIGS. 4A-4D, i.e. FIG. 5A shows a structure prepared by an operation after that of FIG. 4D.

First, the embodiment shown in FIGS. 4A-4G will be further described in detail.

Specifically, referring to FIG. 4A first, 5301 is performed to provide the substrate 10.

The substrate 10 may be an elementary substance semiconductor material substrate such as a silicon (Si) substrate, a germanium (Ge) substrate, etc., a compound semiconductor material such as a silicon germanium (SiGe) substrate, etc., or a silicon on insulator (SOI) substrate, a germanium on insulator (GeOI) substrate, etc.

Subsequently, referring to FIG. 4B, S302 is performed to form a first semiconductor chip 30 on the substrate 10. The first semiconductor chip 30 has a first surface 311 that is bare and the first surface 311 has a silicon-containing surface.

In one embodiment, the first semiconductor chip 30 is a logic die.

Referring to FIG. 4B again, prior to performing S302, an adhesive layer 20 is formed on the substrate 10. The adhesive layer 20 is positioned between the substrate 10 and the first semiconductor chip 30 to bond the substrate 10 and the first semiconductor chip 30. The adhesive layer 20 can bond the substrate 10 and the first semiconductor chip 30 together and enhance adhesion between them, thereby improving the firmness of the semiconductor package structure.

Subsequently, referring to FIG. 4C, S303 is performed to form a first layer of second semiconductor chips 41 on the first surface 311 of the first semiconductor chip 30. The first layer of the second semiconductor chips 41 have second surfaces 411 opposite to the first surface 311.

It should be understood that the second surface of the first layer of the second semiconductor chips 41 is also the second surface of the second semiconductor chip structures.

The second semiconductor chips may be DRAM chips, SRAM chips, EEPROM chips, or other storage chips.

In actual operation, before the first layer of the second semiconductor chips 41 are formed, conductive bumps 60 are formed on the first semiconductor chip 30, and then the first layer of the second semiconductor chips 41 are formed on the conductive bumps 60.

The first semiconductor chip 30 is electrically connected with the first layer of the second semiconductor chips 41 through the conductive bumps 60.

In some embodiments, referring to FIG. 2, outer surfaces of the conductive bumps 60 have silicon-containing surfaces 611. The silicon-containing surfaces of the conductive bumps can improve the jointing performance between the package structure and the conductive bumps and can further alleviate the warping problem of the package structure.

Specifically, in order to ensure the electrical connection performance of the conductive bumps, the silicon-containing surface can be formed only on the sidewalls of the conductive bumps, and the silicon-containing surface is not formed on the surface where the conductive bumps are jointed to the upper and lower chips.

The material of the silicon-containing surfaces 611 of the conductive bumps 60 may be silicon dioxide.

In other embodiments, as shown in FIG. 4C, outer surfaces of the conductive bumps 60 may not have silicon-containing surfaces.

Subsequently, referring to FIG. 4C, S304 is performed to form a first package compound structure 51 between the first semiconductor chip 30 and the first layer of the second semiconductor chips 41 by spin coating. The first package compound structure 51 has a joint surface. The joint surface covers at least the first surface 311 of the first semiconductor chip 30 and the second surfaces 411 of the second semiconductor chips 41. The joint surface has a silicon-containing surface.

The material of the silicon-containing surface of the first package compound structure 51 may be Spin-on-Glass (SOG), silicon-containing Spin-on-Dielectric (SOD), or other silicon-containing spin-coating materials.

In the embodiment of the present disclosure, the joint surface of the first package compound structure and the surface of the chips both contain silicon, i.e. both are silicon surfaces. Compared with packaging with molding compound, the jointing performance of the interface can be improved, thereby alleviating the problems of warping and damage of the package structure.

Subsequently, referring to FIG. 4E and FIG. 4F, the method further includes:

forming one or more layers of the second semiconductor chips on the first layer of the second semiconductor chips 41 to form the second semiconductor chip structures 40. A second package compound structure 52 wrapping the second semiconductor chip structures 40 is formed by spin coating. The second package compound structure 52 is jointed to the first package compound structure 51. The second package compound structure 52 includes a silicon-containing oxide.

The silicon-containing compound may be Spin-on-Glass (SOG), silicon-containing Spin-on-Dielectric (SOD), or other silicon-containing spin-coating material.

Figure 4E:
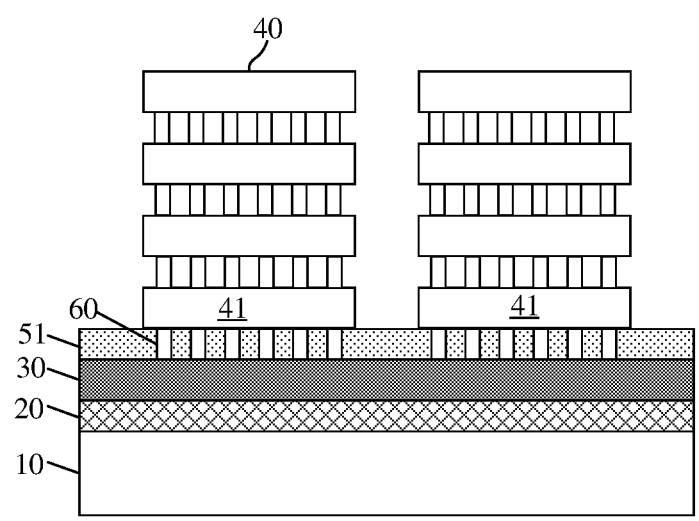

Specifically referring to FIG. 4E first, one or more layers of second semiconductor chips are formed on the first layer of second semiconductor chips 41 to form the second semiconductor chip structures 40. The number of the second semiconductor chips in the second semiconductor chip structures 40 may be more, including but not limited to two, four, eight, twelve, sixteen or the like. In the embodiment of the present disclosure as shown in FIG. 4E, the number of the second semiconductor chips stacked in the second semiconductor chip structures 40 is four.

More specifically, before an upper layer of the second semiconductor chips 41 is formed, conductive bumps 60 are formed on a lower layer of the second semiconductor chips, and then the upper layer of the second semiconductor chips are formed. For example, before the second layer of the second semiconductor chips are formed, conductive bumps 60 are formed on the first layer of the second semiconductor chips, and then the second layer of the second semiconductor chips are formed on the conductive bumps 60.

The adjacent two layers of the second semiconductor chips in the second semiconductor chip structures 40 may be electrically connected through the conductive bumps 60.

In one embodiment, the number of the second semiconductor chip structures is greater than or equal to 2. A plurality of the second semiconductor chip structures are paratactic on the first surface of the first semiconductor chip. In the embodiment of the present disclosure as shown in FIG. 4E, the number of the second semiconductor chip structures is 2.

Subsequently, referring to FIG. 4F, the second package compound structure 52 wrapping the second semiconductor chip structures 40 is formed by spin coating. By forming the second package compound structure 52 wrapping the second semiconductor chip structures 40, and the material of the second package compound structure 52 being a silicon-containing oxide, the warping problem of the second semiconductor chip structures 40 can be alleviated, thereby further alleviating the warping problem of the whole package structure.

In one embodiment, the Young's modulus of the first package compound structure 51 is less than the Young's modulus of the second package compound structure 52.

Figure 4F:
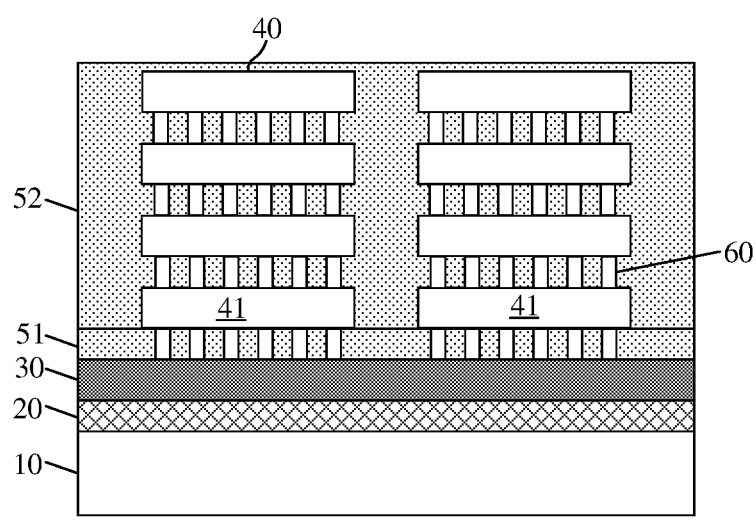

In the embodiment shown in FIG. 4F, the second package compound structure 52 is a single-layer structure that wraps the second semiconductor chip structures 40. The Young's modulus of the second package compound structure 52 is constant in the direction from the first semiconductor chip 30 to the second semiconductor chip structures 40. In the embodiment of the present disclosure, since the Young's modulus of the second package compound structure is constant, the second package compound structure can be formed in the same step using the same material, thereby not only alleviating the warping problem of the chip but also simplifying the process.

Subsequently, referring to FIG. 4G, after forming the second package compound structure 52, the method further includes the following operations. Through holes are formed at a periphery of the second semiconductor chip structures 40 and/or between adjacent two second semiconductor chip structures 40 by etching. The through holes are filled to form filling layers 70. The Young's modulus of the filling layers 70 is greater than the Young's modulus of the first package compound structure 51 and of the second package compound structure 52.

Figure 4G:
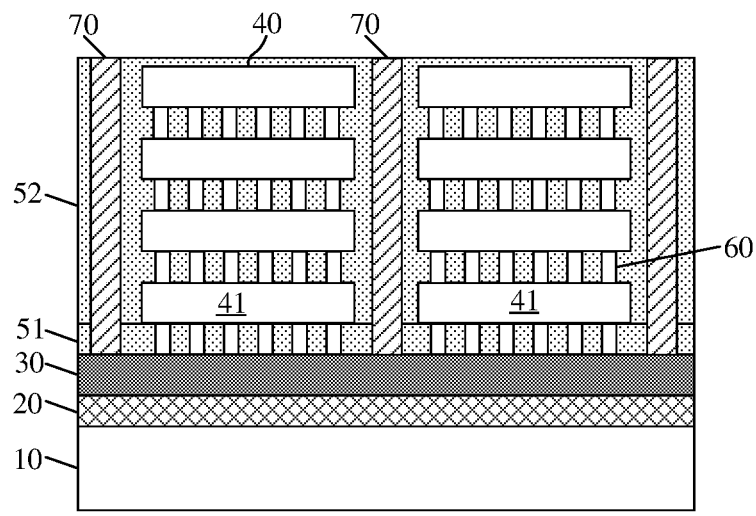

In the embodiment shown in FIG. 4G, the filling layers 70 are formed at a periphery of the second semiconductor chip structures 40 and between adjacent two second semiconductor chip structures 40.

In some other embodiments, the filling layers 70 may be formed only at the periphery of the second semiconductor chip structures 40, or only between adjacent two second semiconductor chip structures 40.

Specifically, a mask layer may be first grown on the upper surface of the second package compound structure 52, and then patterned to obtain a pattern of through holes to be formed on the mask layer. The mask layer may be patterned by a photolithography process. The mask layer may be a photoresist mask or a hard mask to be patterned by photolithography. When the mask layer is a photoresist mask, the mask layer is patterned through the operations of exposure, development, removal of the photoresist and the like.

Then, according to the pattern of the through holes to be formed, through holes having a certain depth is formed by etching, and the depth of the through holes may be extended to the upper surface of the first semiconductor chip. Here, for example, the through holes can be formed by a wet or dry etching process.

Next, the through holes are filled to form filling layers 70.

Young's modulus is a physical quantity that can describe the ability of solid materials to resist deformation. The greater Young's modulus, the greater the ability to resist deformation. When Young's modulus is too low, it will be difficult to maintain the rigidity of the package structure, and problems such as deformation, warping or damage are prone to occur. Accordingly, in the embodiments of the present disclosure, by forming the filling layers 70 at the periphery of the second semiconductor chip structures 40, and/or, between adjacent two second semiconductor chip structures 40, and the Young's modulus of the filling layer 70 being larger than that of the package compound structures, the filling layers 70 can have sufficient strength to support the entire package structure, so that the package structure is not prone to deformation, warping, damage or the like.

In one embodiment, a material of the filling layers 70 includes glass fiber or carbon fiber. The Young's modulus of glass fiber or carbon fiber is large enough to alleviate the warping of the package structure.

Next, the embodiment shown in FIGS. 5A-5E will be further described in detail. The operations before FIG. 5A are the same as those shown in FIGS. 4A-4D, and will not be repeated here.

First, referring to FIGS. 5A-5D, after forming the first package compound structure 51, the method further includes the following operations. A first layer of second package compound 521 wrapping the first layer of the second semiconductor chips 41 is formed by spin coating. A second layer of second semiconductor chips 42 is formed on the first layer of the second semiconductor chips 41. A second layer of the second package compound 522 wrapping the second layer of the second semiconductor chips 42 is formed by spin coating. The above operations are repeated in sequence until forming an Nth layer of the second package compound wrapping a last layer of the second semiconductor chips, in which N is greater than or equal to 2. As a result, a second package compound structure is formed by a plurality of layers of the second package compound. The second package compound structure includes a silicon-containing compound.

In an actual preparation process, N can be 2, 4, 8, 12 or 16. Specifically, in the embodiment as shown in FIGS. 5A-5D, N is equal to 4.

In one embodiment, except for the first layer of the second package compound, from the second layer of the second package compound to the Nth layer of the second package compound, each layer of the second package compound not only wraps one layer of the second semiconductor chips, but also wraps the conductive bumps 60 below the second semiconductor chips.

Specifically, referring to FIG. 5A first, a first layer of second package compound 521 wrapping the first layer of the second semiconductor chips 41 is formed by spin coating.

Subsequently, referring to FIG. 5B, a layer of conductive bumps 60 are first formed on the first layer of the second semiconductor chips 41, and then the second layer of the second semiconductor chips 42 are formed on the conductive bumps 60.

Subsequently, referring to FIG. 5C, the second layer of the second package compound 522 wrapping the second layer of the second semiconductor chips 42 and the conductive bumps 60 below the second layer of the second semiconductor chips 42 is formed by spin coating.

Figure 5B:
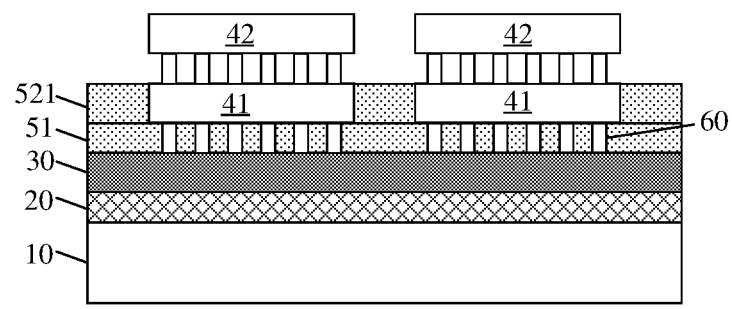
Figure 5C:
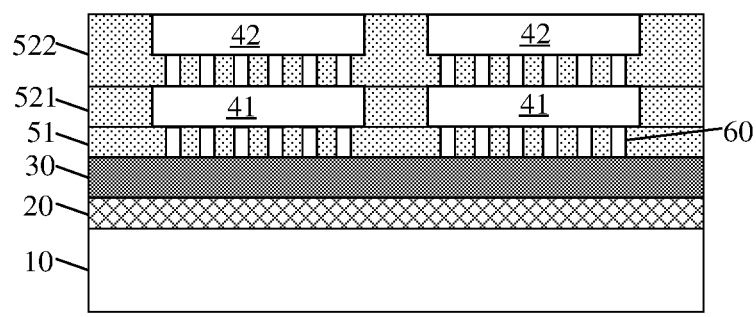
Figure 5D:
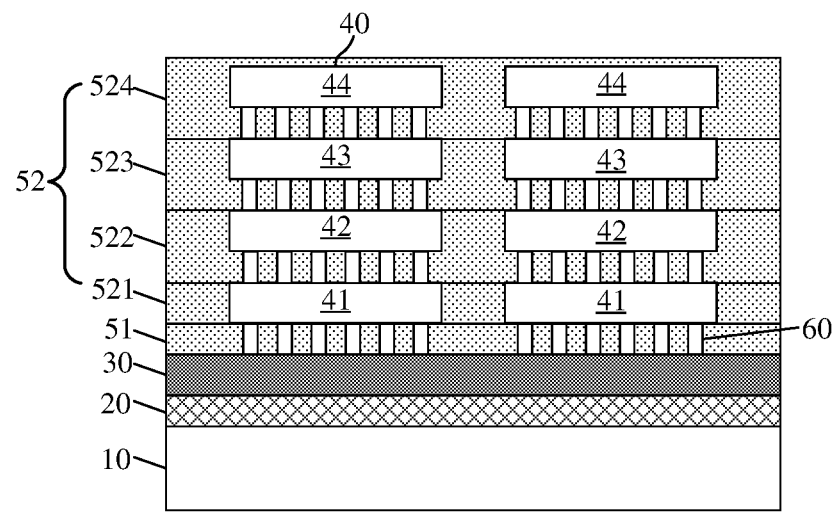

Next, referring to FIG. 5D, the operations of FIG. 5B and FIG. 5C are sequentially repeated to form a third layer of the second package compound 523 wrapping the third layer of the second semiconductor chips 43 and the conductive bumps 60 below the third layer of the second semiconductor chips 43, and a fourth layer of the second package compound 524 wrapping the fourth layer of the second semiconductor chips 44 and the conductive bumps 60 below the fourth layer of the second semiconductor chips 44.

In one embodiment, the Young's modulus of the first package compound structure 51 is less than the Young's modulus of the second package compound structure 52.

In one embodiment, the Young's modulus of layers of the second package compounds increases gradually from the first layer of the second package compound 521 to the Nth layer of the second package compound.

A material with a low Young's modulus can absorb stress and reduce delaminating and warping of the chips. Therefore, the less the number of chip layers stacked in the direction from the first semiconductor chip 30 to the second semiconductor chip structures 40, the less the stress to be withstood. Accordingly, in the above embodiments, the Young's modulus of the first package compound structure is set to be less than the Young's modulus of the second package compound structure, and the Young's modulus of layers of the package compound in the second package compound structure are set to gradually increase in the direction from the first layer of the second package compound to the Nth layer of the second package compound, so that the stress environment of the package structure can be more uniform, and the warping problem of the chips can be further alleviated.

Subsequently, referring to FIG. 5E, a plurality of layers of second semiconductor chips form the second semiconductor chip structures 40. After forming the second package compound structure 52, the method further includes the following operations. Through holes are formed at a periphery of the second semiconductor chip structures 40 and/or between adjacent two second semiconductor chip structures 40 by etching. The through holes are filled to form filling layers 70. The Young's modulus of the filling layers 70 is greater than the Young's modulus of the first package compound structure 51 and the second package compound structure 52.

Figure 5E:
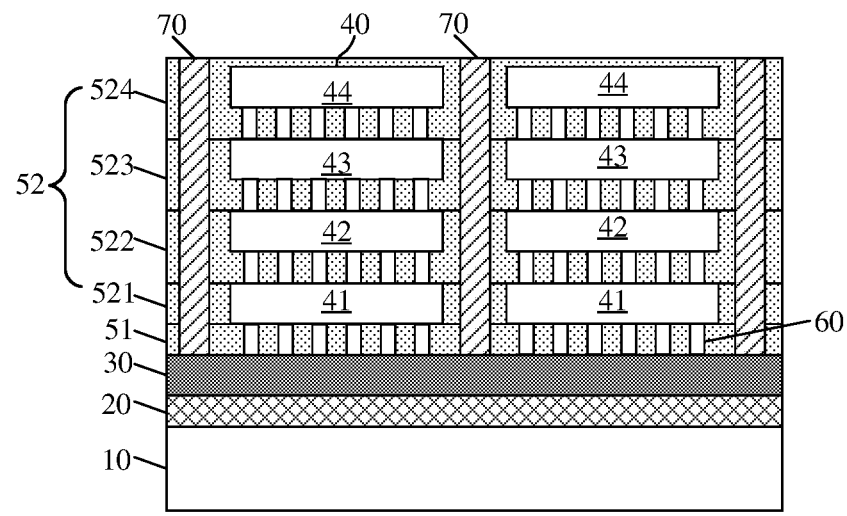

In the embodiment shown in FIG. 5E, the filling layers 70 are formed at a periphery of the second semiconductor chip structures and between adjacent two second semiconductor chip structures 40.

In some other embodiments, the filling layers 70 may also be formed only at the periphery of the second semiconductor chip structures 40, or between adjacent two second semiconductor chip structures 40.

In the embodiment shown in FIG. 5E, the method for forming the filling layers are identical to the method for forming the filling layers in the embodiment shown in FIG. 4G and will not be repeated here.

In one embodiment, a material of the filling layers 70 includes glass fiber or carbon fiber. The Young's modulus of glass fiber or carbon fiber is large enough to alleviate the warping of the package structure.

The descriptions above are only illustrative implementations of the present disclosure, and are not intended to limit the scope of protection of the present disclosure. Any modification, equivalent replacement and improvement made within the spirit and principles of the present disclosure are encompassed by the protection scope of the present disclosure.

The invention claimed is:

1. A semiconductor package structure, comprising:
a substrate;
a first semiconductor chip located on the substrate, the first semiconductor chip having a first surface that is bare and the first surface having a silicon-containing surface;
second semiconductor chip structures located on the first surface of the first semiconductor chip, the second semiconductor chip structures having second surfaces opposite to the first surface, wherein the second semiconductor chip structures comprise a plurality of second semiconductor chips that are stacked;
a first package compound structure having a joint surface, the joint surface covering at least the first surface of the first semiconductor chip and the second surfaces of the second semiconductor chip structures, wherein the joint surface has a silicon-containing surface; and
a second package compound structure, wherein the second package compound structure is jointed to the first package compound structure to wrap the second semiconductor chip structures,
wherein the second package compound structure comprises a silicon-containing compound;
wherein the second package compound structure comprises a plurality of layers of second package compound stacked in sequence, each layer of the second package compound wrapping one layer of the second semiconductor chips, and
wherein a Young's modulus of each layer of the second package compound gradually increases in a direction from the first semiconductor chip to the second semiconductor chip structures.

2. The semiconductor package structure according to claim 1, wherein
the semiconductor package structure further comprises:
conductive bumps located between the first semiconductor chip and the second semiconductor chip structures and between adjacent two layers of the second semiconductor chips,
wherein the first package compound structure and the second package compound structure wrap the conductive bumps.

3. The semiconductor package structure according to claim 2, wherein
outer surfaces of the conductive bumps have a silicon-containing surface.

4. The semiconductor package structure according to claim 1, wherein
a number of the second semiconductor chip structures is greater than or equal to 2, and wherein a plurality of the second semiconductor chip structures are paratactic on the first surface of the first semiconductor chip.

5. The semiconductor package structure according to claim 4, wherein
the semiconductor package structure further comprises:
filling layers located at least at periphery of the second semiconductor chip structures or between adjacent two second semiconductor chip structures,
wherein a Young's modulus of the filling layers is greater than a Young's modulus of the first package compound structure.

6. The semiconductor package structure according to claim 5, wherein
a material of the filling layers comprises glass fiber or carbon fiber.

7. The semiconductor package structure according to claim 1, wherein
a Young's modulus of the first package compound structure is less than a Young's modulus of the second package compound structure.

8. A method for preparing a semiconductor package structure, comprising:
providing a substrate;
forming a first semiconductor chip on the substrate, the first semiconductor chip having a first surface that is bare and the first surface having a silicon-containing surface;
forming a first layer of second semiconductor chips on the first surface of the first semiconductor chip, the first layer of the second semiconductor chips having second surfaces opposite to the first surface;
forming a first package compound structure between the first semiconductor chip and the first layer of the second semiconductor chips by spin coating, the first package compound structure having a joint surface, the joint surface covering at least the first surface of the first semiconductor chip and the second surfaces of the second semiconductor chips, wherein the joint surface has a silicon-containing surface;

forming one or more layers of second semiconductor chips on the first layer of second semiconductor chips to form second semiconductor chip structures; and forming a second package compound structure wrapping the second semiconductor chip structures by spin coating, wherein the second package compound structure is jointed to the first package compound structure;

wherein the second package compound structure comprises a silicon-containing compound;

wherein the second package compound structure comprises a plurality of layers of second package compound stacked in sequence, each layer of the second package compound wrapping one layer of the second semiconductor chips, and wherein a Young's modulus of each layer of the second package compound gradually increases in a direction from the first semiconductor chip to the second semiconductor chip structures.

9. The method according to claim 8, wherein the method further comprises:

forming a first layer of second package compound wrapping the first layer of the second semiconductor chips by spin coating;

forming a second layer of second semiconductor chips on the first layer of the second semiconductor chips;

forming a second layer of the second package compound wrapping the second layer of the second semiconductor chips by spin coating; and repeating foregoing operations in sequence until forming an Nth layer of the second package compound wrapping a last layer of the second semiconductor chips, wherein N is greater than or equal to 2, wherein a second package compound structure is formed by a plurality of layers of the second package compound, the second package compound structure comprising a silicon-containing compound.

10. The method according to claim 8, wherein second semiconductor chip structures are formed by a plurality of layers of second semiconductor chips, wherein a number of the second semiconductor chip structures is greater than or equal to 2, and a plurality of the second semiconductor chip structures are paratactic on the first surface of the first semiconductor chip.

11. The method according to claim 10, wherein the method further comprises: after forming the second package compound structure, forming through holes at least at a periphery of the second semiconductor chip structures or between adjacent two second semiconductor chip structures by etching; and filling the through holes to form filling layers, wherein a Young's modulus of the filling layers is greater than a Young's modulus of the first package compound structure and of the second package compound structure.

12. The method according to claim 11, wherein a material of the filling layers comprises glass fiber or carbon fiber.

13. The method according to claim 8, wherein a Young's modulus of the first package compound structure is less than a Young's modulus of the second package compound structure.

* * * * *